United States Patent
Takizawa (10) Patent No.: US 9,082,645 B2
(45) Date of Patent: Jul. 14, 2015

(54) MANUFACTURING METHOD OF SEMICONDUCTOR MODULE

(71) Applicant: RENESAS ELECTRONICS CORPORATION, Kawasaki-shi, Kanagawa (JP)

(72) Inventor: Tatsuya Takizawa, Tokyo (JP)

(73) Assignee: RENESAS ELECTRONICS CORPORATION, Kanagawa (JP)

(*) Notice: Subject to any disclaimer, the term of this patent is extended or adjusted under 35 U.S.C. 154(b) by 19 days.

(21) Appl. No.: 13/769,073

(22) Filed: Feb. 15, 2013

(65) Prior Publication Data

US 2013/0224891 A1   Aug. 29, 2013

(30) Foreign Application Priority Data

Feb. 21, 2012 (JP) .................. 2012-034823

(51) Int. Cl.
*G01R 31/26* (2014.01)
*H01L 21/66* (2006.01)
(Continued)

(52) U.S. Cl.
CPC .............. *H01L 22/10* (2013.01); *G01R 1/0408* (2013.01); *G01R 31/2886* (2013.01);
(Continued)

(58) Field of Classification Search
CPC ..... H01L 21/10; H01L 2924/14; H01L 24/00; H01L 22/10; G01R 1/04; G01R 31/2886
USPC ............... 438/15, 740, 831; 29/840; 257/707, 257/722, 737, 738, 778
See application file for complete search history.

(56) References Cited

U.S. PATENT DOCUMENTS 2,484,736 A * 10/1949 Razek .............................. 374/44
5,604,978 A * 2/1997 Sherif et al. .................... 29/840
(Continued)

FOREIGN PATENT DOCUMENTS

| JP | 2000-105267 A | 4/2000 |
|---|---|---|
| JP | 2005-55330 A | 3/2005 |
| JP | 2005-308453 A | 11/2005 |
| JP | 2006-269685 A | 10/2006 |

OTHER PUBLICATIONS

Notification of Reasons for Refusal, Japanese Patent Applcation No. 2012-034823 dated Apr. 21, 2015 with full English translation.

*Primary Examiner* — Reema Patel
*Assistant Examiner* — Syed Gheyas
(74) *Attorney, Agent, or Firm* — McDermott Will & Emery LLP (57) ABSTRACT

Parts of electronic components are not exposed to temperature deviating from an appropriate operation temperature range when an electric characteristic test of a semiconductor module having an interposer substrate over which plural kinds of electronic components are mounted is carried out. A heat sink for an electronic component is incorporated in a lid of a test socket used for an electric characteristic test of an MCM. A heat dissipation sheet is attached to part of the bottom face of the heat sink and an adiabatic sheet is attached to another part. The heat dissipation sheet has thermal conductivity larger than the adiabatic sheet and transfers heat generated from an electronic component of a high heat value to the heat sink during operation. The adiabatic sheet inhibits the heat generated from an electronic component of high heat value from being transferred to another electronic component through the heat sink.

6 Claims, 12 Drawing Sheets

(51) Int. Cl.
  *G01R 1/04* (2006.01)
  *G01R 31/28* (2006.01)
  *H01L 23/42* (2006.01)

(52) U.S. Cl.
  CPC ............ *H01L 23/42* (2013.01); *H01L 2224/16* (2013.01); *H01L 2224/73253* (2013.01); *H01L 2924/1305* (2013.01); *H01L 2924/15311* (2013.01); *H01L 2924/19105* (2013.01)

(56) References Cited

U.S. PATENT DOCUMENTS

| | | | |
|---|---|---|---|
| 7,119,531 | B2 | 10/2006 | Sakata |
| 7,295,438 | B2 | 11/2007 | Ishiduka |
| 7,834,455 | B2 * | 11/2010 | Sugimura et al. ............. 257/738 |
| 2005/0204554 | A1 * | 9/2005 | Sillner ........................ 29/834 |
| 2009/0178275 | A1 * | 7/2009 | Dang et al. ................... 29/832 |
| 2010/0181665 | A1 | 7/2010 | Casey et al. |

* cited by examiner

MANUFACTURING METHOD OF SEMICONDUCTOR MODULE

CROSS-REFERENCE TO RELATED APPLICATIONS

The disclosure of Japanese Patent Application No. 2012-034823 filed on Feb. 21, 2012 including the specification, drawings and abstract is incorporated herein by reference in its entirety.

BACKGROUND

The present invention relates to a manufacturing technology of a semiconductor module, in particular to a technology effectively applicable to the manufacture of a multichip module (hereunder referred to as an MCM) having a plurality of electronic components mounted over a wiring substrate.

Patent Literature 1 (Japanese Unexamined Patent Publication No. 2000-105267) discloses an inspection device to securely inspect a semiconductor component having a concavo-convex or uneven surface such as a chip-size package where a plurality of semiconductor chips having different thicknesses from each other are mounted by a flip-chip method.

A socket of the inspection device described in the literature includes a main body over which a semiconductor component as a target of inspection is mounted and a lid installed over the top face of the main body. A bag including a soft and heavy-duty material is attached to the underside of the lid and the interior of the bag is filled with a liquid. The semiconductor component has a carrier over the bottom face of which a plurality of electrode terminals are formed in a matrix state and a plurality of semiconductor chips having different thicknesses from each other are mounted over the top face of the carrier. Further, a plurality of measuring terminals corresponding to the electrode terminals of the carrier are formed in the socket main body and each of the measuring terminals is fixed to the socket main body through a spring so as to be flexibly movable.

When inspection is carried out, a semiconductor component is loaded at a prescribed position of the socket main body and the bag attached to the underside of the lid presses the top face of the semiconductor component. The bag to press the semiconductor component is soft because of the material and liquid in the interior of the bag and surely touches each of the surfaces of the semiconductor chips having different thicknesses from each other. Further, by the hydrostatic pressure of the liquid contained in the interior of the bag, each of the surfaces of the semiconductor chips having different thicknesses from each other equally receives the same pressure. Consequently, the semiconductor component is evenly pressed downward without tilting, thus the electrode terminals over the bottom face of the carrier surely touch the measuring terminals of the socket main body, and hence the measurement is stabilized.

PREVIOUS TECHNICAL LITERATURE

Patent Literature

[Patent Literature 1]
Japanese Unexamined Patent Publication No. 2000-105267

SUMMARY

In order to realize downsizing of an electronic device (electronic equipment), an MCM type semiconductor device formed by collectively mounting a plurality of electronic components (semiconductor devices, chip parts, etc.) scattered over a motherboard (mounting board) over an interposer substrate (a relay wiring substrate mounted over a motherboard to electrically couple electronic components to the motherboard) for example is considered to be effective.

In an MCM having different kinds of electronic components mounted over an interposer substrate however, electronic components having different ratings or different specifications from each other may be mounted together in some cases and some of the electronic components may operate normally only within a prescribed temperature range.

An object of the present invention is to provide a technology for inhibiting a part of an electronic component from being exposed to a temperature deviating from an appropriate operation temperature range at an electric characteristic test (test process) of a semiconductor module having an interposer substrate over which plural kinds of electronic components are mounted.

Another object of the present invention is to provide a technology which makes it possible to accurately carry out an electric characteristic test of a semiconductor module having an interposer substrate over which plural kinds of electronic components are mounted.

Yet another object of the present invention is to provide a technology of improving the reliability of a semiconductor module having an interposer substrate over which plural kinds of electronic components are mounted.

The aforementioned and other objects and novel features of the present invention will be obvious through the descriptions and attached drawings in the present specification.

The representative gist of the invention disclosed in the present application is briefly explained as follows.

A manufacturing method of a semiconductor module according to an embodiment of the present invention includes the processes of: (a) preparing a structure having first and second electronic components mounted over the top face of an interposer substrate and a plurality of solder materials arranged over the bottom face of the interposer substrate; (b) preparing a test socket having a first section having a recess and a second section having a first plane and a second plane; and (c) after the processes of (a) and (b), carrying out an electric characteristic test of the structure by containing the structure inside the recess of the test socket so that the bottom face of the interposer substrate may face the bottom face of the recess of the test socket while a load is applied from the side of the top face of the interposer substrate to the structure with the second section of the test socket. An appropriate operation temperature range of the second electronic component is narrower than an appropriate operation temperature range of the first electronic component. In the process of (c), after the first and second planes of the second section are arranged over the first and second electronic components respectively, loads are applied to the first and second electronic components through a first member interposed between the first plane and the first electronic component and a second member interposed between the second plane and the second electronic component respectively.

The effects obtained by the representative gist of the invention disclosed in the present application are briefly explained as follows.

According to an embodiment of the present invention stated above, it is possible not to expose a part of an electronic component to a temperature deviating from an appropriate operation temperature range at an electric characteristic test of a semiconductor module having an interposer substrate over which plural kinds of electronic components are mounted.

BRIEF DESCRIPTION OF THE DRAWINGS

FIGS. 1A, 1B, 1C, 1D, and 1E show an MCM according to an embodiment of the present invention, in which

FIGS. 3A and 3B show an interposer substrate used for manufacturing an MCM according to an embodiment of the present invention, in which

DETAILED DESCRIPTION

Embodiments according to the present invention are hereunder explained in detail in reference to drawings. Here, in all the drawings for explaining the embodiments, members having an identical function are represented with an identical code and are not explained repeatedly. Further, in the following embodiments, identical or similar parts are not explained repeatedly in principle unless it is particularly needed. Furthermore, in the drawings for explaining the embodiments, a hatched part may sometimes be omitted partially even in a sectional view in order to make a configuration easy to understand.

Embodiment 1

Figure 1A:
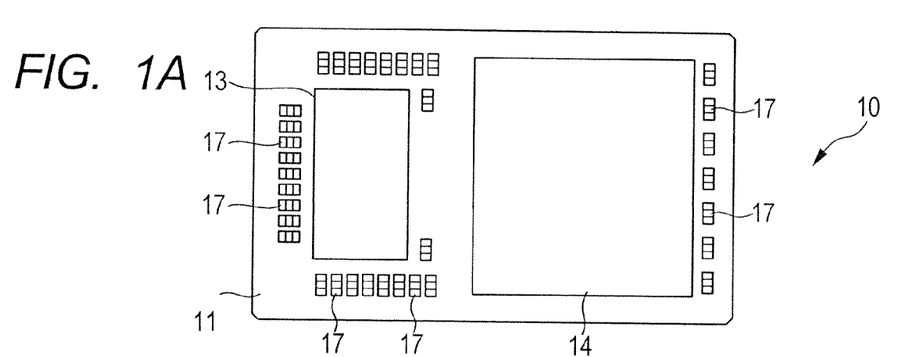
FIG. 1A is a top view, FIG. 1B a left short side view, FIG. 1C a long side view, FIG. 1D a right short side view, and FIG. 1E a bottom view.
Figure 1B:
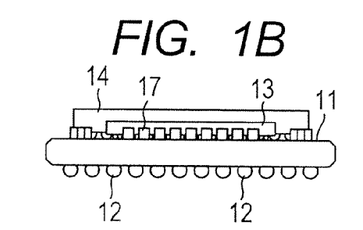
Figure 1C:
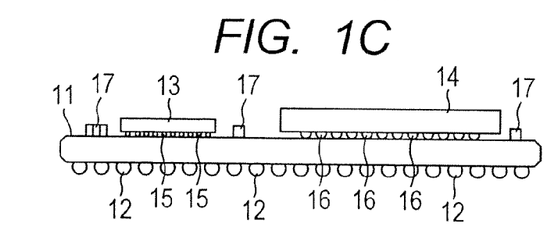
Figure 1D:
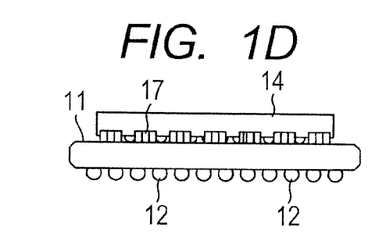
Figure 1E:
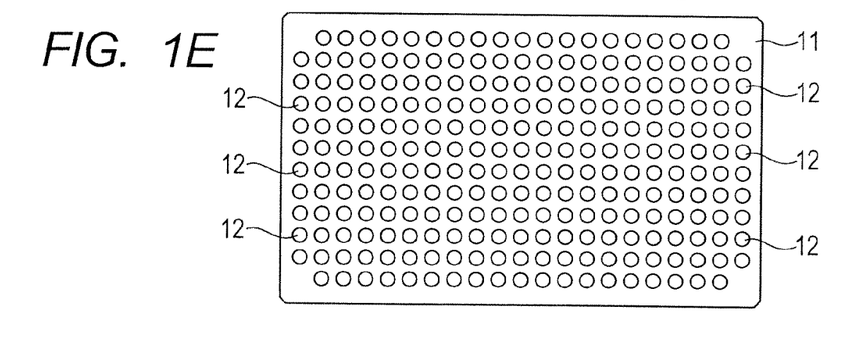

FIGS. 1A, 1B, 1C, 1D, and 1E show an MCM according to the present embodiment, in which FIG. 1A is a top view, FIG. 1B a left short side view, 1C a long side view, 1D a right short side view, and 1E a bottom view.

An MCM (semiconductor module) 10 according to the present embodiment includes an interposer substrate 11 having a rectangular shape in a planar view and a plurality of electronic components mounted over the top face of the interposer substrate 11.

The interposer substrate 11 is a double-layered wiring substrate having wiring layers (not shown in FIGS. 1A, 1B, 1C, 1D, and 1E) over both the faces (top face and bottom face) of a core layer for example and a plurality of solder balls (solder material) 12 to mount the MCM 10 over a motherboard (mounting board) are coupled to the wiring layer over the bottom face. The core layer includes an insulator formed by impregnating epoxy resin or the like into glass fiber or carbon fiber for example and the wiring layers comprise an electrically conductive material of a copper (Cu) system for example.

The plural electronic components mounted over the top face of the interposer substrate 11 include a semiconductor chip (first electronic component) 13 and a BGA (Ball Grid Array: second electronic component) 14. The semiconductor chip 13 is mounted over the top face of the interposer substrate 11 through a plurality of bump electrodes 15 formed over the principal plane (device plane) of the semiconductor chip 13 by a flip-chip method. Meanwhile, the BGA 14 is mounted over the top face of the interposer substrate 11 through a plurality of solder balls 16 formed over the bottom face of the BGA 14. The bump electrodes 15 include gold (Au) and the solder balls 16 include a tin (Sn)-alloy system solder material. Though it is not shown in the figures, the BGA 14 has a packaged structure including a wiring substrate, a semiconductor chip mounted over the top face of the wiring substrate, and a resin sealant to seal the semiconductor chip. The solder balls 16 of the EGA 14 are coupled to a wiring layer (bump land) over the bottom face of the wiring substrate.

Figure 2:
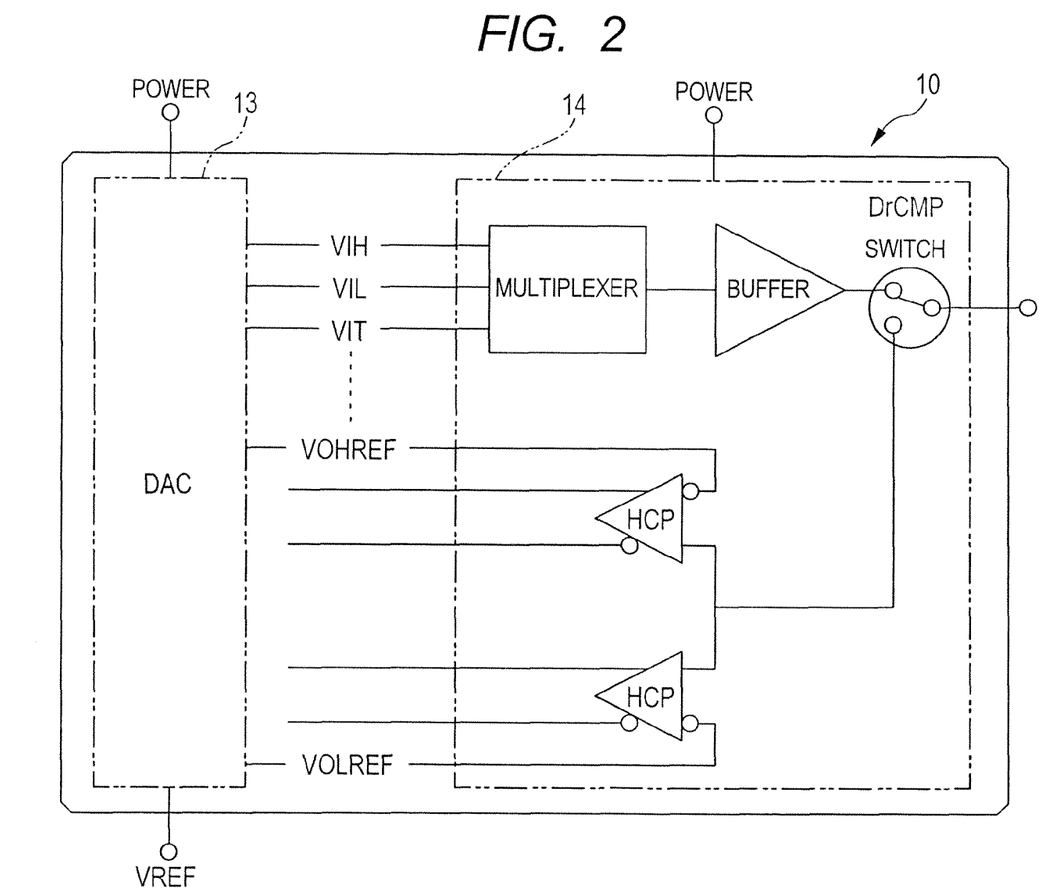
FIG. 2 is a block diagram showing a circuit configuration of an MCM according to an embodiment of the present invention.

As shown in FIG. 2, a DC-AC converter (DAC) circuit is formed in the semiconductor chip 13. Meanwhile, a driver/comparator (DrCMP) circuit comprising a multiplexer, a buffer, a switch, comparators (HCP, LCP), and the like is formed in the semiconductor chip incorporated in the BGA 14. Further, the semiconductor chip 13 and the BGA 14 are electrically coupled to each other through the wiring layer of the interposer substrate 11.

The driver/comparator circuit formed in the semiconductor chip of the BGA 14 includes a CMOS transistor which consumes a small amount of electricity and features a low heat-value at the time of operation. On the other hand, the DC-AC converter circuit formed in the semiconductor chip 13 includes a bipolar transistor and a CMOS transistor and features a large amount of electricity consumption and a high heat-value at the time of operation. Consequently, the semiconductor chip 13 is mounted over the interposer substrate 11 in a bare chip state in consideration of heat dissipation.

Some other electronic components may also be mounted together with the two electronic components (semiconductor chip 13 and BGA 14) over the top face of the interposer substrate 11. In the present embodiment for example, as shown in FIGS. 1A, 1B, 1C, 1D, and 1E, a plurality of condensers 17 which are small-sized chip components (passive components) are mounted around the semiconductor chip 13 and the BGA 14 respectively. The condensers 17 are electrically coupled to the wiring layer over the top face of the interposer substrate 11 through the solder material.

Figures 3A, 3B:
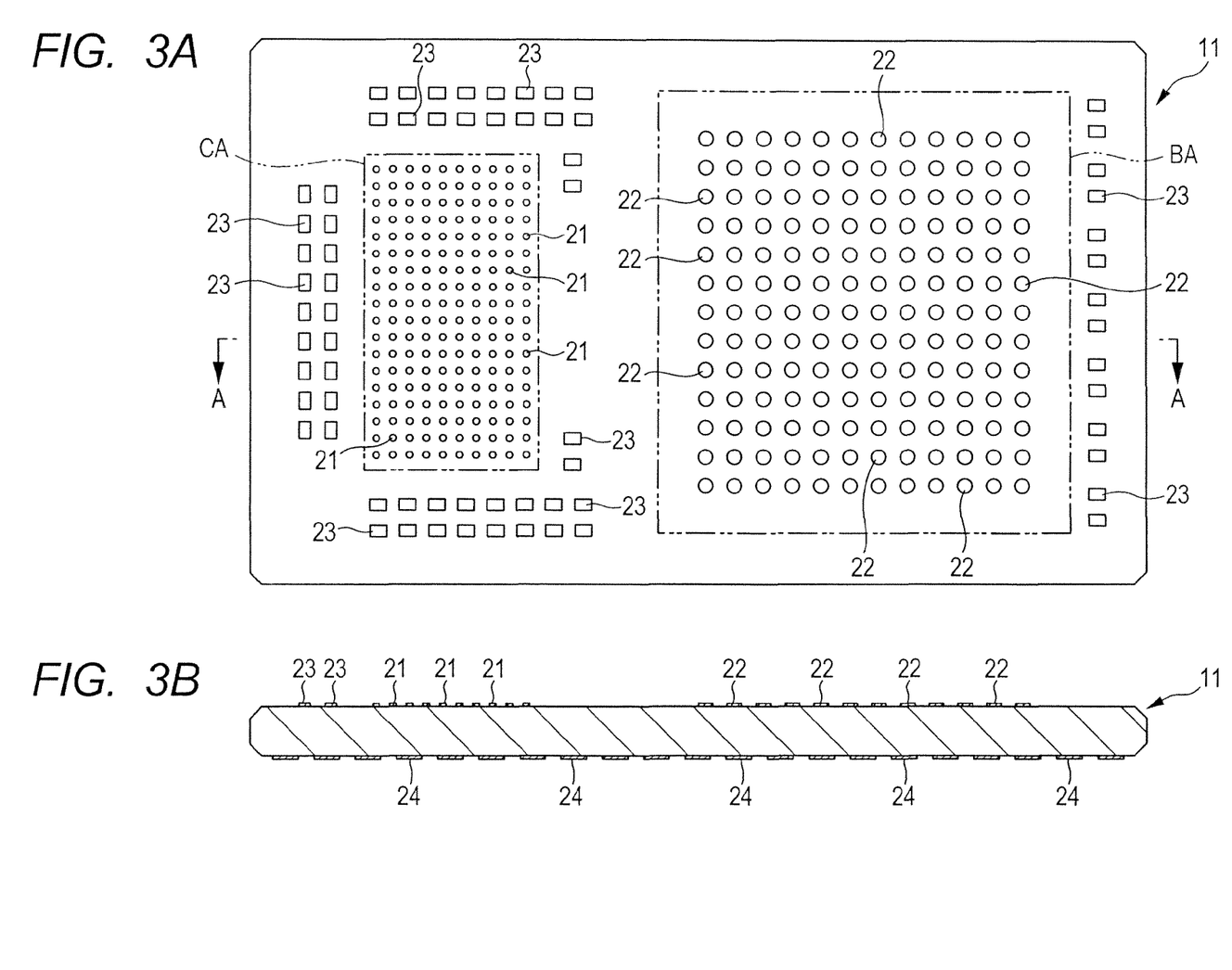
FIG. 3A is a top view and FIG. 3B is a sectional view taken on line A-A in FIG. 3A.

FIGS. 3A and 3B show the interposer substrate 11 used for manufacturing the MCM 10, in which FIG. 3A is a top view and FIG. 3B is a sectional view taken on line A-A in FIG. 3A.

As previously described, the interposer substrate 11 is an insulator (core layer) including a glass-epoxy system resin having wiring layers formed over both the faces. As shown in FIG. 3A, the wiring layer over the top face of the interposer substrate 11 includes a plurality of first electrode terminals (bump lands) 21 allocated in a first electronic component mounted region CA, a plurality of second electrode terminals (bump lands) 22 allocated in a second electronic component mounted region BA, and a plurality of third electrode terminals 23 allocated around both the first electronic component mounted region CA and the second electronic component mounted region BA. Each of the first electrode terminals 21, the second electrode terminals 22, and the third electrode terminals 23 is configured by covering the surface of a copper (Cu) wiring with a nickel (Ni) plated layer and a gold (Au) plated layer for example.

Meanwhile, as shown in FIG. 3B, the wiring layer over the bottom face of the interposer substrate 11 includes a plurality of external electrode terminals (bump lands) 24. The external electrode terminals 24 are configured by covering the surface of a copper (Cu) wiring with a nickel (Ni) plated layer and a gold (Au) plated layer in the same way as the electrode terminals (21, 22, and 23) on the side of the top face of the interposer substrate 11.

Though not shown in the figures, an insulation layer (solder resist) is formed over both the faces of an actual interposer substrate 11 except the surfaces of the electrode terminals (21, 22, 23, and 24). Further, the electrode terminals (21, 22, 23, and 24) over both the faces of the interposer substrate 11 are electrically coupled to each other through conductors in via holes (through-holes) running through the core layer.

Figure 4:
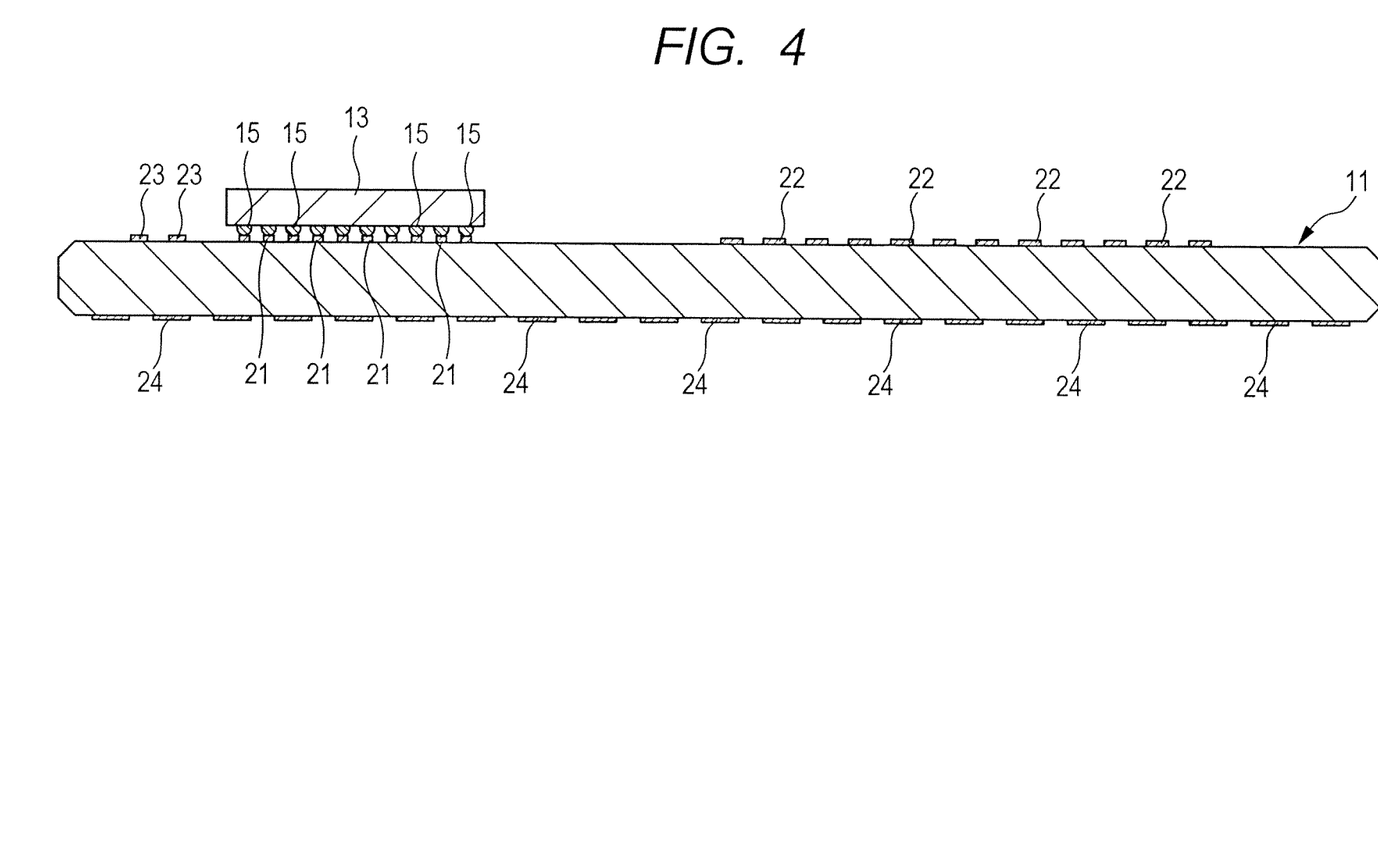
FIG. 4 is a sectional view showing a manufacturing method of an MCM according to an embodiment of the present invention.

In order to assemble the MCM 10 with the interposer substrate 11, firstly as shown in FIG. 4, the first electrode terminals 21 formed over the top face of the interposer substrate 11 and the bump electrodes 15 formed over the principal plane of the semiconductor chip 13 are allocated so as to face each other and electrically coupled to each other by a flip-chip bonding method through thermo-compression.

Figure 5:
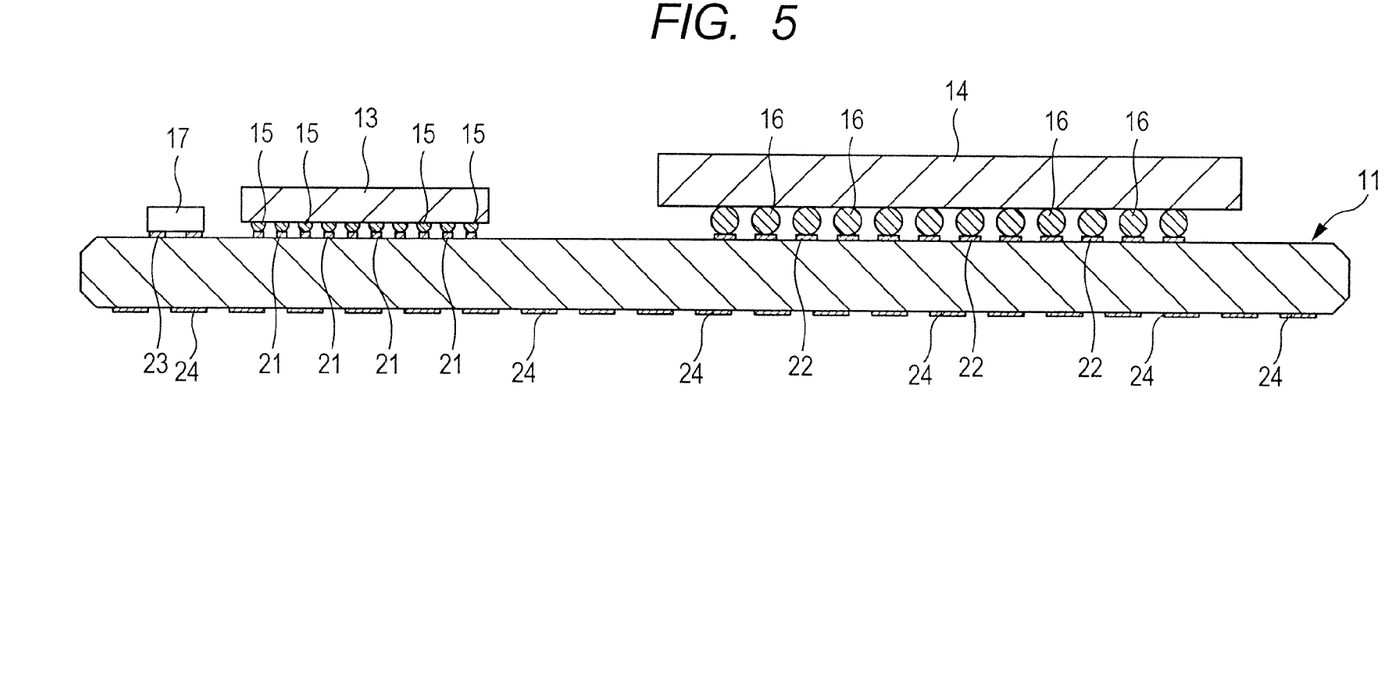
FIG. 5 is a sectional view showing the manufacturing method of the MCM following FIG. 4.

Successively, as shown in FIG. 5, the second electrode terminals 22 formed over the top face of the interposer substrate 11 are allocated so as to face the solder balls 16 formed over the bottom face of the BGA 14 and also the third electrode terminals 23 are allocated so as to face the condensers 17. A solder material (solder paste) is supplied to the surfaces of the third electrode terminals 23 by a printing method or the like beforehand. Successively, the second electrode terminals 22 of the interposer substrate 11 are electrically coupled to the solder balls 16 of the BGA 14 and the third electrode terminals 23 are electrically coupled to the condensers 17 by heating the interposer substrate 11 in a reflow furnace and reflowing the solder material (solder balls 16 and solder paste).

When the first electrode terminals 21 of the interposer substrate 11 are bonded to the bump electrodes 15 of the semiconductor chip 13 by the flip-chip bonding method through thermo-compression, a bonding temperature is required to be 300° C. to 350° C. in order to acquire a practically necessary bonding strength. Meanwhile, a reflow temperature of the tin (Sn) alloy system solder material is about 217° C. to 220° C.

Consequently, when the semiconductor chip 13, the BGA 14, and the condensers 17 are mounted over the interposer substrate 11, it is desirable that firstly the semiconductor chip 13 is mounted by a flip-chip bonding method requiring a high bonding temperature (300° C. to 350° C.) and successively the BGA 14 and the condensers 17 are mounted by a reflow soldering method of melting the solder material at a lower temperature (about 217° C. to 220° C.)

Here, in the case of adopting a thermo-compression flip-chip bonding method jointly using ultrasonic waves instead of the flip-chip bonding method, the temperature for bonding the first electrode terminals 21 to the bump electrodes 15 can be lowered to around 200° C. In this case therefore, the semiconductor chip 13 can be mounted after the BGA 14 and the condensers 17 are mounted.

Figure 6:
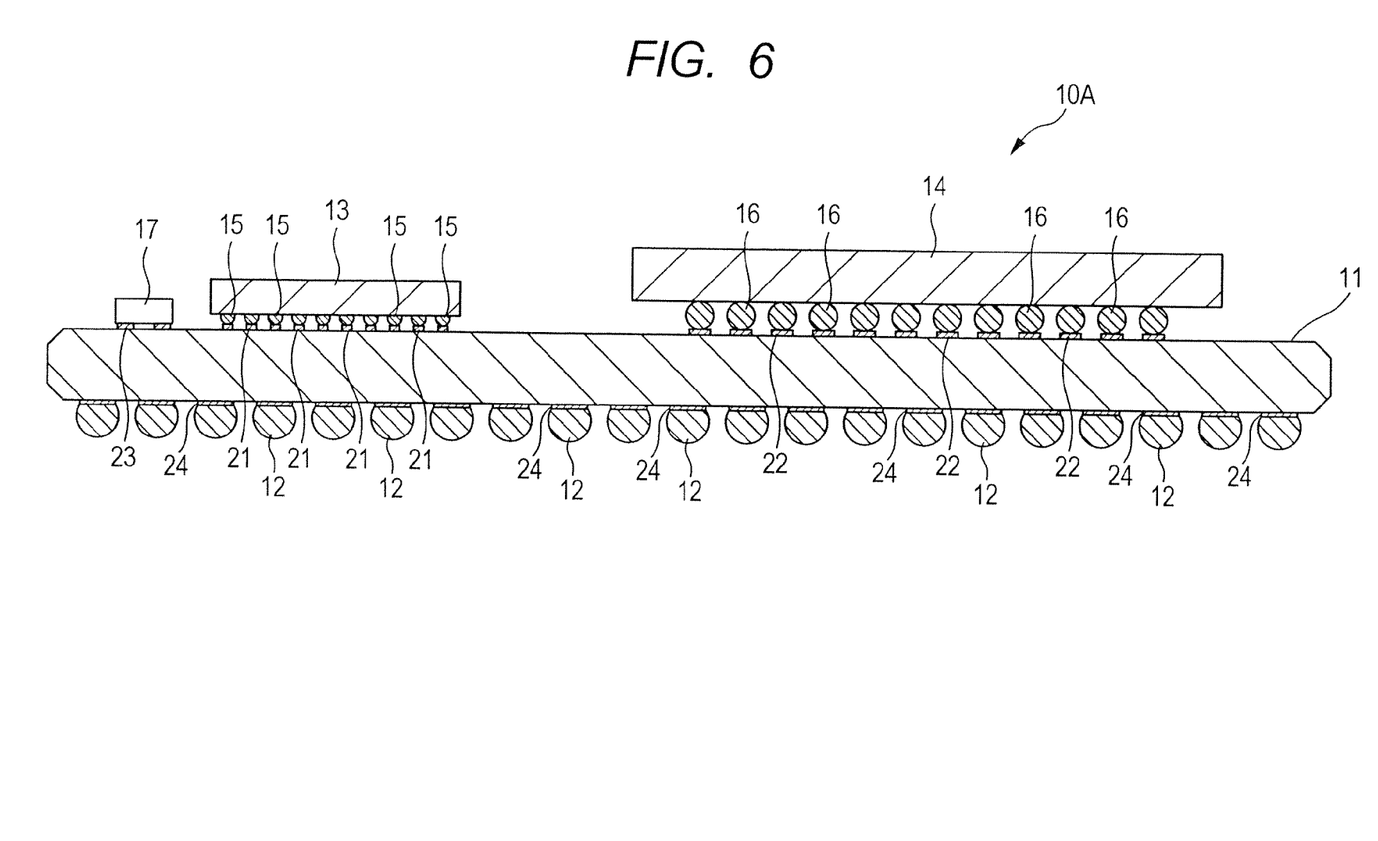
FIG. 6 is a sectional view showing the manufacturing method of the MCM following FIG. 5.

Successively, as shown in FIG. 6, the solder balls 12 are coupled to the external electrode terminals 24 over the bottom face of the interposer substrate 11 by a reflow soldering method. The solder balls 12 are coupled to the external electrode terminals 24 for example by supplying a solder material (solder paste) over the surfaces of the external electrode terminals 24 by a printing method or the like, successively allocating a solder material formed into the shape of a ball over the surface of each of the external electrode terminals 24, and successively reflowing the solder materials by heating the interposer substrate 11.

The assembly of the MCM 10 is completed through the above processes. Meanwhile, an MCM 10 from the completion of the assembly processes to the final manufacturing process is hereunder referred to as an MCM structure 10A.

An electric characteristic test (probe test) process for verifying the operation of an MCM structure 10A is explained hereunder.

Figure 10:
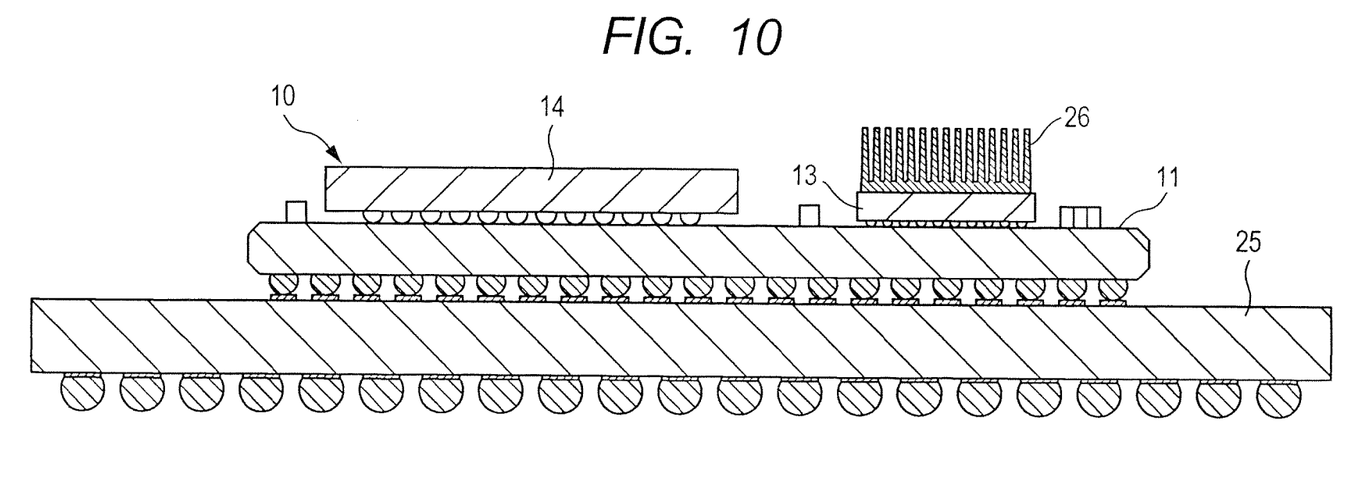
FIG. 10 is a sectional view showing a state of mounting an MCM according to an embodiment of the present invention over a motherboard.

As described above, a circuit which generates a large amount of heat during operation is formed in the semiconductor chip 13 mounted over the interposer substrate 11 in the MCM structure 10A. Consequently, when a completed MCM 10 is mounted over a motherboard 25 as shown in FIG. 10 and activated, it is necessary to keep the temperature of the semiconductor chip 13 within an appropriate operation temperature range (for example 60° C. or under) by attaching a heat dissipation member such as a heat sink 26 to the semiconductor chip 13 in order to inhibit abnormal operation of the circuit caused by the overheating of the semiconductor chip 13. Consequently, in order to carry out an electric characteristic test of the MCM structure 10A with a high degree of accuracy, it is necessary to carry out the test in the state of cooling the semiconductor chip 13 by using a heat dissipation member and keeping an appropriate operation temperature range in the same way as actual operation.

In a circuit formed in a semiconductor chip of the BGA 14 in contrast, an appropriate operation temperature range thereof stays around the ordinary temperature since the amount of heat generated during operation is small. That is, it is necessary to keep the temperature of the BGA 14 around the ordinary temperature in order to stably operate the circuit formed in the semiconductor chip of the BGA 14. Consequently, in order to carry out an electric characteristic test of the MCM structure 10A with a high degree of accuracy, it is necessary to carry out the test in the state of keeping the temperature of the BGA 14 around the normal temperature.

Meanwhile, when the MCM structure 10A is installed in an existing test socket and an electric characteristic test is carried out, some of heat generated from the semiconductor chip 13 is transmitted to the BGA 14 through a heat dissipation member and thus the temperature of the BGA 14 rises. When the temperature of the BGA 14 exceeds an appropriate operation temperature range, the operation of a circuit formed in the semiconductor chip of the BGA 14 is destabilized and hence the accuracy of the electric characteristic test deteriorates undesirably.

Consequently, when an electric characteristic test of a semiconductor structure in which plural kinds of electronic components having different appropriate operation temperature ranges from each other are mounted over a single interposer substrate like an MCM structure 10A according to the present embodiment is carried out, it is necessary to devise a means for keeping each of the plural kinds of the electronic components in an appropriate operation temperature range, in other words, to devise a means for not exposing a part of the plural kinds of the electronic components to a temperature deviating from the appropriate operation temperature ranges.

Figure 7:
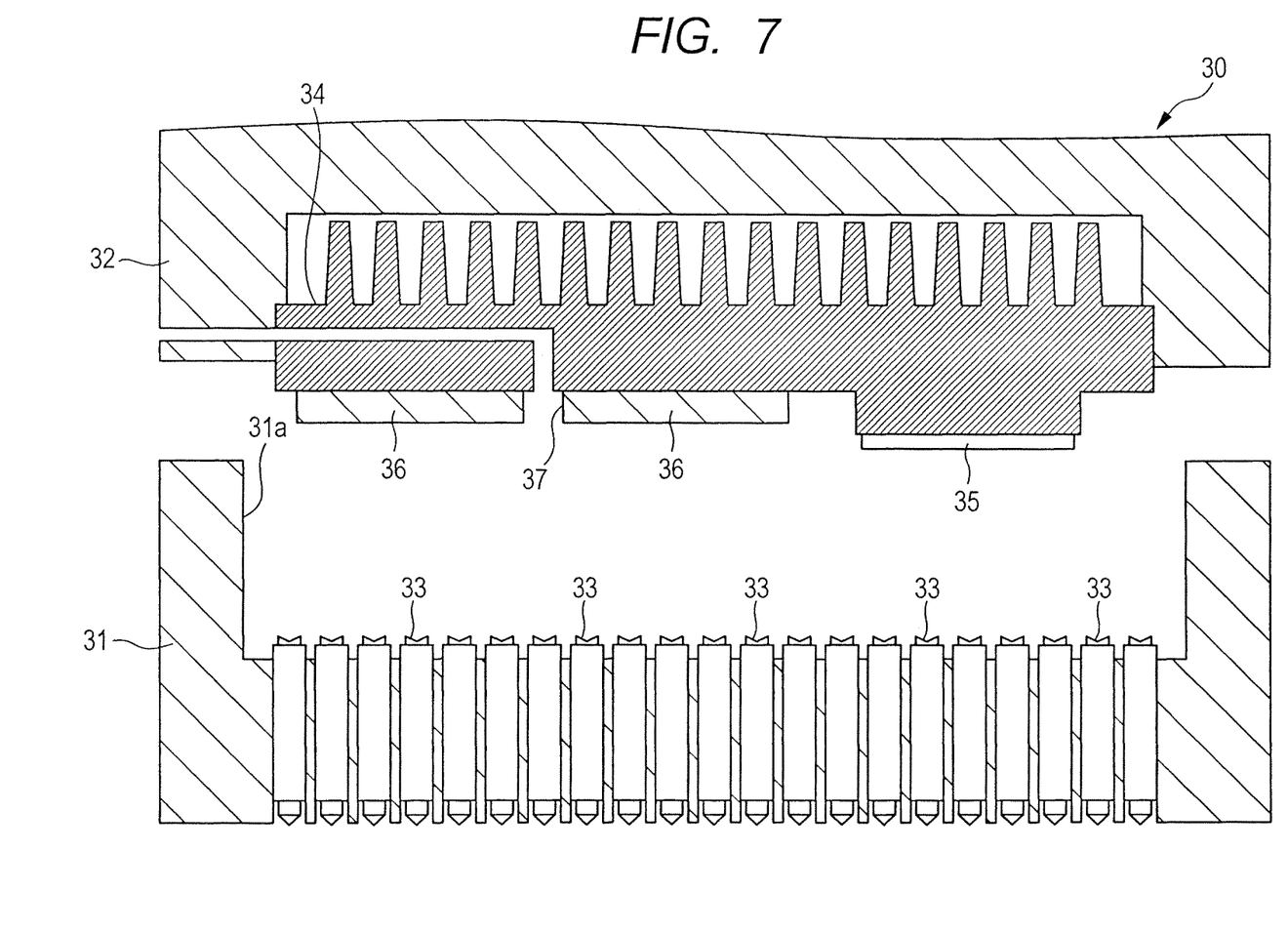
FIG. 7 is a sectional view showing a substantial part of a test socket used for manufacturing an MCM according to an embodiment of the present invention.

In the present embodiment therefore, an electric characteristic test of an MCM structure 10A is carried out with a test socket shown in FIG. 7.

As shown in FIG. 7, a test socket 30 used in the present embodiment includes a main body (first section, lower section) 31 and a lid (second section, upper section) 32 located above the main body 31. Although not shown in the figure, a test board located under the main body 31 is electrically coupled to the main body 31 and a tester main body is electrically coupled to the test board.

The main body 31 of the test socket 30 has a storage space (recess) 31a of a concave shape to store an MCM structure 10A shown in FIG. 6 and, at the bottom face of the storage space 31a, a plurality of contact probes (probe pins) 33 corresponding to the external electrode terminals 24 of the MCM structure 10A are arranged. Each of the contact probes 33 is fixed to the bottom face of the storage space 31a and is movable in the vertical direction by the elastic force of a spring.

The lid 32 located above the main body 31 has a function as a lid for covering the storage space 31a of the main body 31. Further, a heat sink 34 for cooling an electronic component subjected to an electric characteristic test is contained in the lid 32. The heat sink 34 includes a material such as aluminum (Al) having a high thermal conductivity and is detachably attached to the lid 32.

A heat dissipation sheet (first member) 35 is attached to a part (first plane) of the bottom face of the heat sink 34 and an adiabatic sheet (second member) 36 is attached to another part (second plane) of the bottom face. The heat dissipation sheet 35 and the adiabatic sheets 36 are buffers to prevent defects and damages caused by the direct touch of an electronic component subjected to an electric characteristic test to the bottom face of the heat sink 34.

In the two kinds of sheets (35 and 36) attached to the bottom face of the heat sink 34, the heat dissipation sheet 35 includes a material having a higher thermal conductivity (lower thermal resistance in other words) than the adiabatic sheet 36 and a high hardness and can well transmit the heat generated from an electronic component during operation to the heat sink 34. As a buffer having such a high thermal conductivity, graphite can be named for example. Further, in order to well transmit heat generated from an electronic component to the heat sink 34, it is desirable to reduce the thickness of the heat dissipation sheet 35 within the range not damaging the functions as a buffer. In the present embodiment therefore, a graphite sheet 0.05 to 1.0 mm in thickness with a thermal conductivity of 700 to 1,600 W/mK is used as the heat dissipation sheet 35.

On the other hand, the adiabatic sheet 36 is a member to inhibit heat generated from an electronic component (semiconductor chip 13 in the present embodiment) generating a large amount of heat from being transmitted to another electronic component (BGA 14 in the present embodiment) through the heat sink 34. It is desirable therefore that the adiabatic sheet 36 includes a soft material having a lower thermal conductivity (higher heat resistance in other words) than the heat dissipation sheet 35 and the thickness is heavier than the heat dissipation sheet 35. As such a buffer having a low thermal conductivity as described above, synthetic rubber, more desirably foamable rubber, can be named for example. In the present embodiment, a sponge sheet including low-foamable silicon rubber 1.5 to 12 mm in thickness with a thermal conductivity of less than 1 W/mK is used as the adiabatic sheet 36.

An attraction hole 37 coupled to a vacuum pump (not shown in the figure) outside the test socket 30 is formed at a part of each of the adiabatic sheet 36 and the heat sink 34. The heat sink 34 having the attraction hole 37 is used as a conveyance tool when the MCM structure 10A is stored in the storage space 31a of the main body 31.

It is desirable to form the attraction hole 37 on the side of the adiabatic sheet 36 rather than on the side of the heat dissipation sheet 35. This is because the BGA 14 touching the adiabatic sheet 36 has a larger surface area than the semiconductor chip 13 touching the heat dissipation sheet 35 and, if the attraction hole 37 is formed at the heat dissipation sheet 35, the substantial surface area of the heat dissipation sheet 35 reduces and the heat dissipation effect deteriorates. Here, in a case where the area of the heat dissipation sheet 35 is sufficiently larger than the area of the adiabatic sheet 36, the attraction hole 37 may be formed on the side of the heat dissipation sheet 35 or on both the sides of the heat dissipation sheet 35 and the adiabatic sheet 36.

As shown in FIG. 7, the bottom face of the heat sink 34 to which the two kinds of sheets (35 and 36) are attached has a difference in level. That is, the plane (first plane) of the heat sink 34 to which the heat dissipation sheet 35 is attached protrudes more downward (toward the main body 31) than the plane (second plane) to which the adiabatic sheet 36 is attached.

The MCM structure 10A according to the present embodiment has the semiconductor chip 13 and the BGA 14 which are mounted side-by-side over the top face of the interposer substrate 11 and hence the semiconductor chip 13 in a bare chip state has a lower mounting height (vertical distance from the top face of the interposer substrate 11 to the top face of an electronic component) than the BGA 14 formed by sealing a semiconductor chip with a resin sealant.

Consequently, if the bottom face of the heat sink 34 is flat, the bottom face of the heat sink 34 may not touch the semiconductor chip 13 of a low mounting height or the interposer substrate 11 may tilt obliquely from the bottom face of the storage space 31a. As a result, it comes to be difficult to apply an equal load from above to both the top faces of the semiconductor chip 13 and the BGA 14 and parts of the solder balls 12 formed over the bottom face of the interposer substrate 11 may not touch the contact probes 33 of the test socket 30 undesirably. In the present embodiment therefore, a step corresponding to the difference in mounting height between the semiconductor chip 13 and the BGA 14 is formed at the bottom face of the heat sink 34 so that an equal load may be applied from above to both the top faces of the semiconductor chip 13 and the BGA 14.

Figure 8:
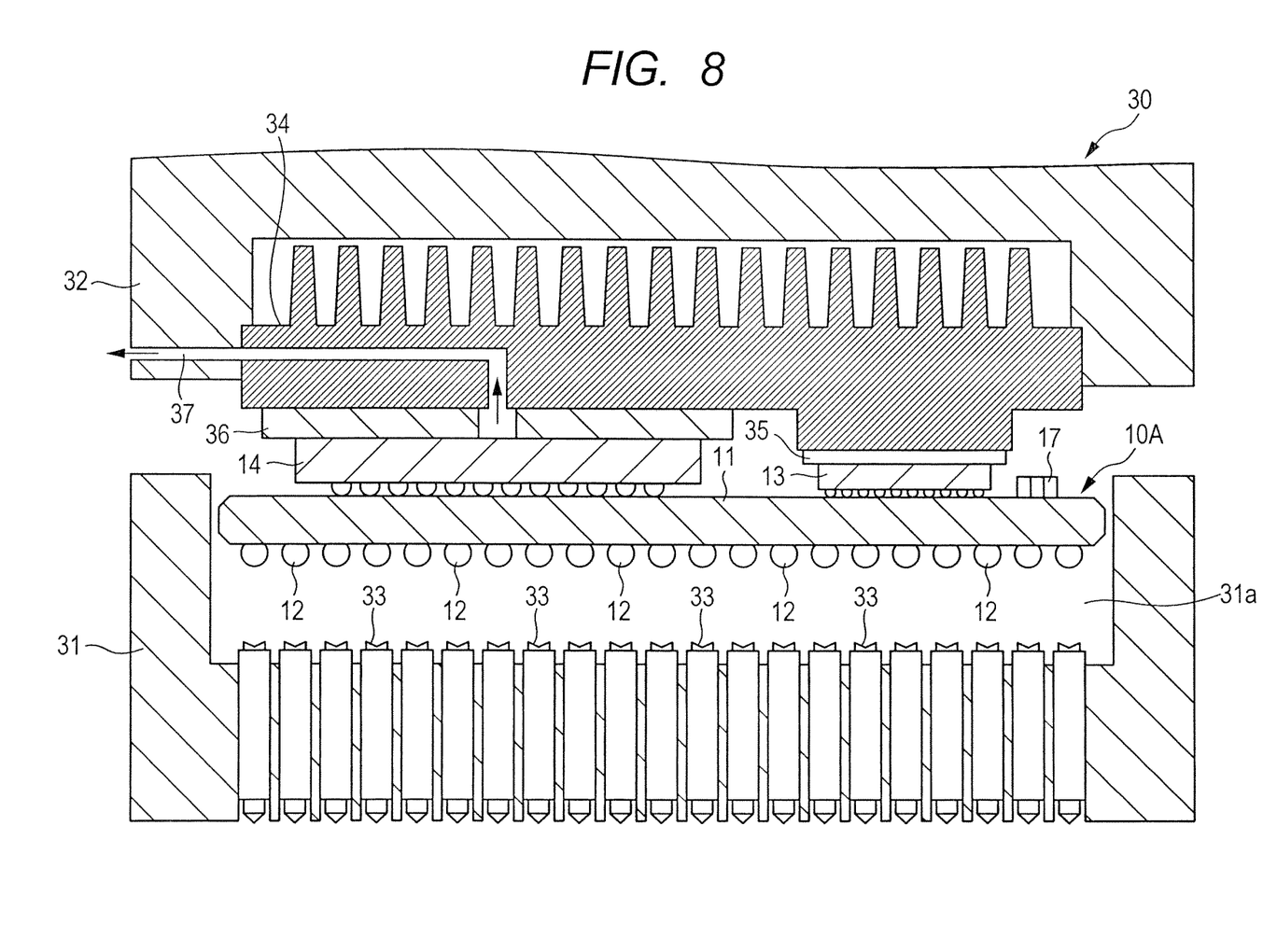
FIG. 8 is a sectional view showing the manufacturing method of the MCM following FIG. 6.

When an electric characteristic test of the MCM structure 10A is carried out by using the test socket 30 configured as stated above, firstly as shown in FIG. 8, the MCM structure 10A is transported to the storage space 31a of the main body 31 while being attracted and held with the heat sink 34 of the test socket 30 and each of the solder balls 12 formed over the bottom face of the interposer substrate 11 faces a corresponding contact probe 33.

Figure 9:
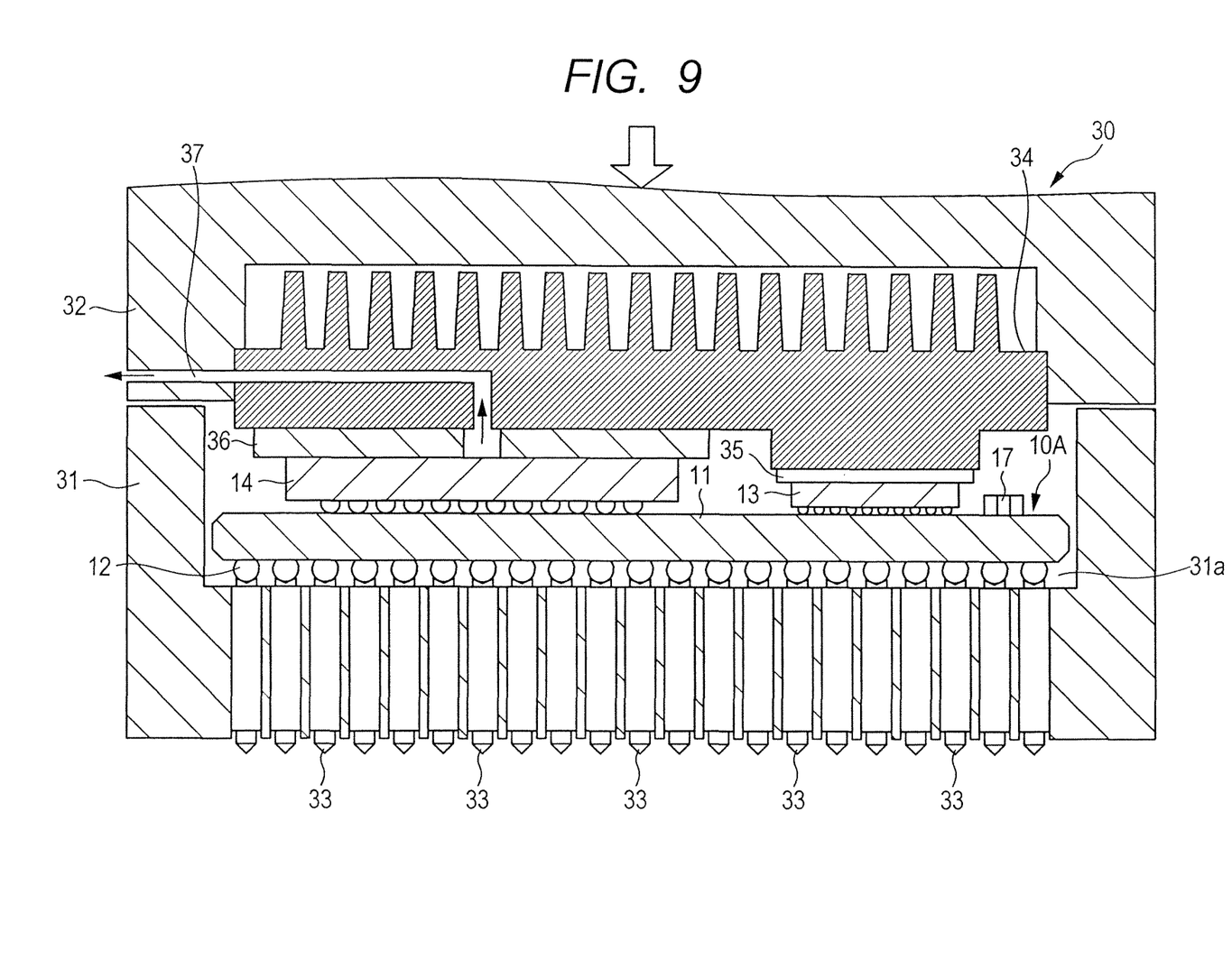
FIG. 9 is a sectional view showing the manufacturing method of the MCM following FIG. 8.

Successively, as shown in FIG. 9, the heat sink 34 is lowered and each of the solder balls 12 formed over the bottom face of the interposer substrate 11 is pressed against a corresponding contact probe 33. On this occasion, since the bottom face of the heat sink 34 has a step corresponding to the difference in mounting height between the semiconductor chip 13 and the BGA 14, an equal load is applied to the top faces of the semiconductor chip 13 and the BGA 14 at about the same time. By so doing, the heat dissipation sheet 35 attached to the bottom face of the heat sink 34 adheres closely to the top face of the semiconductor chip 13, the adiabatic sheet 36 adheres closely to the top face of the BGA 14, and each of the solder balls 12 formed over the bottom face of the interposer substrate 11 touches a corresponding contact probe 33 without fault.

Successively, an electric characteristic test for judging whether the MCM structure 10A is good or defective is carried out by supplying electricity to the semiconductor chip 13 and the MGA 14 in this state through the contact probes 33 and activating the circuit shown in FIG. 2.

On this occasion, a large amount of heat is generated from the semiconductor chip 13. The heat however is smoothly transmitted to the heat sink 34 through the heat dissipation sheet 35 having a high thermal conductivity and hence the temperature of the semiconductor chip 13 is kept within an appropriate operation temperature range. Meanwhile, since the adiabatic sheet 36 is interposed between the heat sink 34 having a temperature raised by absorbing the heat of the semiconductor chip 13 and the BGA 14, the heat of the heat sink 34 is hardly transmitted to the BGA 14. Consequently, the temperature of the BGA 14 is kept around the normal temperature which is in an appropriate operation temperature range.

In this way, in the present embodiment, when an electric characteristic test of the MCM structure 10A is carried out, the temperature of each of the plural kinds of electronic components (semiconductor chip 13 and BGA 14) mounted over the interposer substrate 11 can be kept in each of the appropriate operation temperature ranges and hence the electric characteristic test of the MCM structure 10A can be carried out with a high degree of accuracy.

Successively, an appearance check is applied to the MCM structures 10A which have been judged as good through the electric characteristic test process and good products are selected. In this way, the MCM 10 according to the present embodiment shown in FIGS. 1A, 1B, 1C, 1D, and 1E is completed.

MODIFIED EXAMPLE 1

Figure 11:
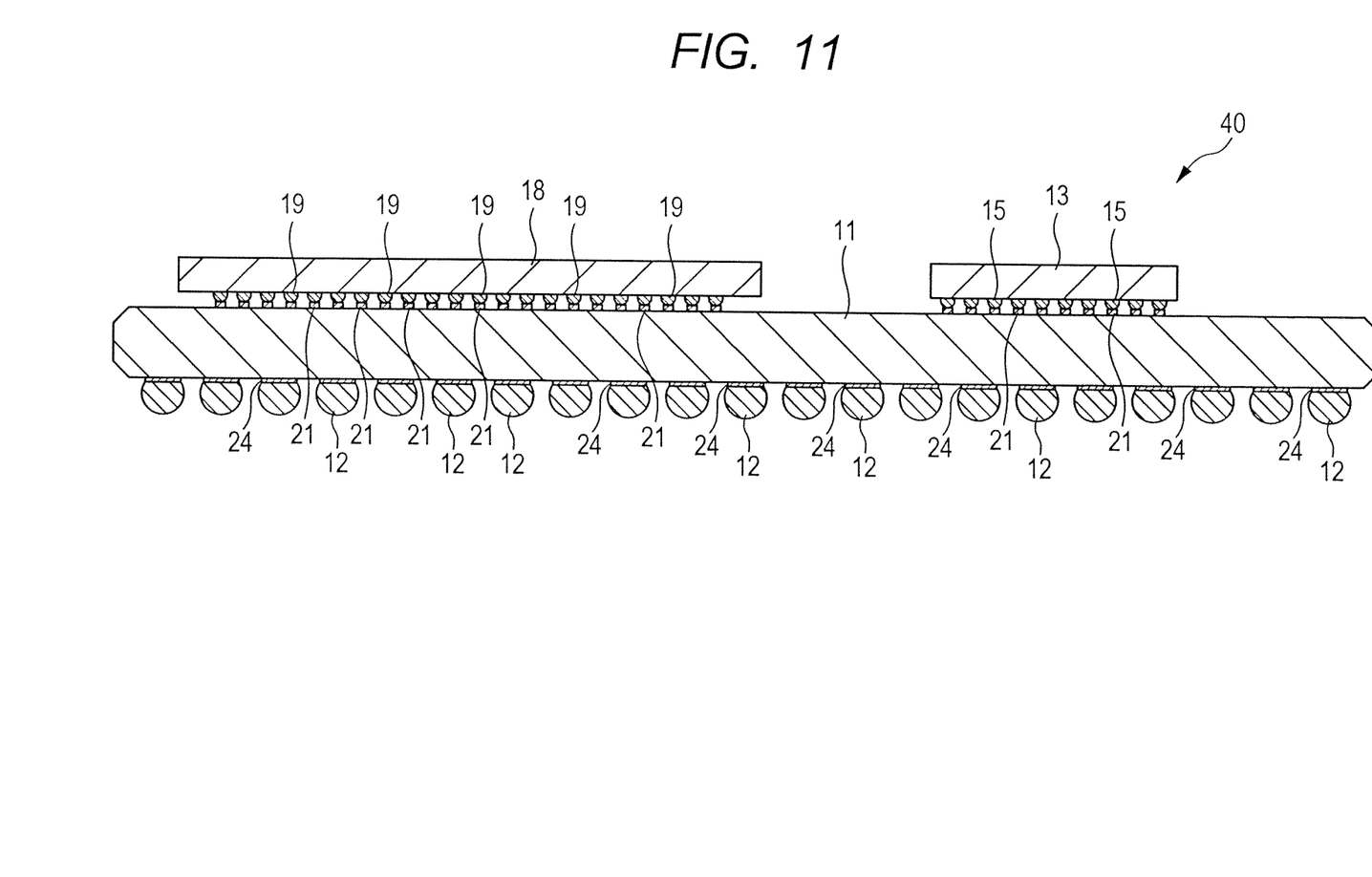
FIG. 11 is a sectional view showing a modified example of an MCM according to the present invention.

An MCM 40 shown in FIG. 11 is a semiconductor module having two semiconductor chips 13 and 18 over the top face of an interposer substrate 11.

A first semiconductor chip 13 is mounted over the top face of the interposer substrate 11 by a flip-chip method through gold (Au) bump electrodes 15 formed over the principal plane of the first semiconductor chip 13. A second semiconductor chip 18 is mounted over the top face of the interposer substrate 11 by a flip-chip method through gold (Au) bump electrodes 19 formed over the principal plane of the second semiconductor chip 18. Here, a circuit which generates a large amount of heat during operation is formed in the first semiconductor chip 13 and a circuit which generates a small amount of heat during operation is formed in the second semiconductor chip 18.

The two semiconductor chips 13 and 18 are both mounted over the interposer substrate 11 by the flip-chip method and hence the mounting heights (vertical distance from the top face of the interposer substrate 11 to the top faces of the semiconductor chips) of the two semiconductor chips 13 and 18 are substantially identical.

Figure 12:
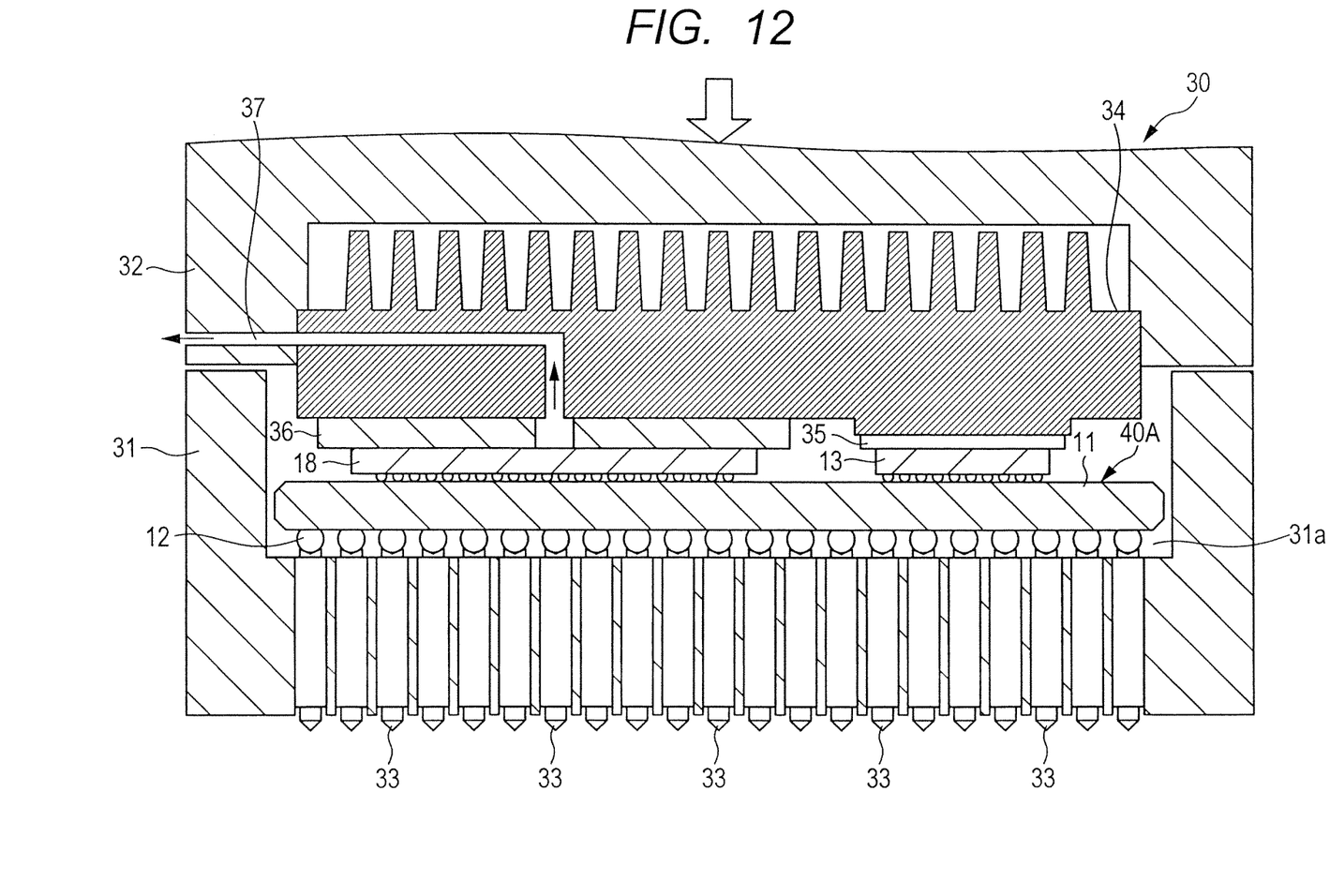
FIG. 12 is a sectional view showing a manufacturing method of a modified example of an MCM according to the present invention.

FIG. 12 shows the method of an electric characteristic test of an MCM structure 40A (MCM 40 in the manufacturing process) by using a test socket 30 described earlier.

As shown in FIG. 12, in the bottom face of the heat sink 34, a heat dissipation sheet 35 having a high thermal conductivity (graphite sheet having a thermal conductivity of 700 to 1,600 W/mK for example) is attached to a plane (first plane) facing the first semiconductor chip 13 generating a large amount of heat and an adiabatic sheet 36 having a low thermal conductivity (sponge sheet including low-foamable silicon rubber having a thermal conductivity of lower than 1 W/mK for example) is attached to another plane (second plane) facing the second semiconductor chip 18 generating a small amount of heat.

The heat dissipation sheet 35 includes a material having a high thermal conductivity but the thermal conductivity is low in comparison with the thermal conductivity of a material (aluminum for example) including the heat sink 34. In order to well transmit the heat generated by the semiconductor chip 13 generating a large amount of heat to the heat sink 34 therefore, it is desirable to reduce the thickness within the range not hindering the functions as a buffer.

On the other hand, although the adiabatic sheet 36 includes a material having a lower thermal conductivity than the heat dissipation sheet 35, it is desirable to increase the thickness of the adiabatic sheet 36 and increase the distance from the bottom face of the heat sink 34 to the semiconductor chip 18 to the greatest possible extent in order to more effectively inhibit the transmission of heat from the heat sink 34 to the semiconductor chip 18 generating a small amount of heat. The adiabatic sheet 36 therefore includes a film thicker than the film of the heat dissipation sheet 35.

In the case where the two semiconductor chips 13 and 18 mounted over the interposer substrate 11 have the same mounting heights, if the thicknesses of the two sheets (heat dissipation sheet 35 and adiabatic sheet 36) attached to the bottom face of the heat sink 34 are different from each other as described above, it is difficult to apply an equal load to the top faces of the two semiconductor chips 13 and 18 by using the heat sink 34.

As a countermeasure against the problem, it is effective to form a step corresponding to the difference in thickness between the heat dissipation sheet 35 and the adiabatic sheet 36 over the bottom face of the heat sink 34 and protrude the plane (first plane) of the heat sink 34 to which the heat dissipation sheet 35 is attached more downward (toward the side of the main body 31) than the plane (second plane) to which the adiabatic sheet 36 is attached as shown in FIG. 12.

In this way, in a case where the two electronic components (semiconductor chips 13 and 18) mounted over the interposer substrate 11 have different appropriate operation temperature ranges even though the electronic components have the same mounting heights, it is possible to prevent the drawback of increasing the temperature of an electronic component (semiconductor chip 18) by the influence of the heat generated from the other electronic component (semiconductor chip 13) and exceeding an appropriate operation temperature range by carrying out an electric characteristic test using the test socket 30 according to the present invention.

Although the invention established by the present inventors has heretofore been explained specifically on the basis of the embodiments, it is needless to say that the present invention is not limited to the above embodiments and may be variously modified within the range not departing from the gist of the invention.

Although a wiring substrate using a glass epoxy resin as an insulator is represented as an example of the interposer substrate in the above embodiments, it is also possible to use a ceramic wiring substrate formed by using ceramics such as aluminum nitride or alumina having a higher thermal resistance than a resin and a heat expansion coefficient close to silicon as an insulator when a semiconductor chip generates a large amount of heat. The wiring layers of the interposer substrate are not limited to two layers but may be four or more layers.

Although the explanations have been made on the basis of an MCM having an electronic component (semiconductor chip) of a high heat value and a low mounting height and another electronic component (BGA) of a low heat value and a high mounting height mounted over an interposer substrate in the above embodiments, inversely the present invention may also be applied to the case where an electronic component of a high mounting height has a higher heat value than an electronic component of a low mounting height.

Although the explanations have been made on the basis of an MCM having two kinds of electronic components of different heat values mounted over an interposer substrate in the above embodiments, the present invention may also be applied to an MCM having three or more kinds of electronic components of different heat values mounted over an interposer substrate. The electronic components mounted over an interposer substrate are not limited to semiconductor chips in a bare chip state or BGAs but may be semiconductor devices having another packaging form.

Although an MCM structure is attracted and transported by using an attraction hole formed at a part of a lid of a test socket in the above embodiments, the means for transporting an MCM structure can be changed arbitrarily. That is, an MCM structure can be transported to a storage space of a test socket by using a transportation tool other than a lid of a test socket.

Although a logic circuit is formed in each of two electronic components in the above embodiments, the present invention is not limited to this case and it is also possible to form a memory circuit in either of two electronic components for example.

Although the present invention is applied to an electric characteristic test process of an MCM structure in the above embodiments, it is also possible to apply the present invention to the manufacture of an MCM having a burn-in-test (heat-up and speed-up test) process for reducing initial failure beforehand. That is, in the case of carrying out a burn-in-test of an MCM structure having an interposer substrate over which several kinds of electronic components of different appropriate operation temperatures are mounted, it is possible to inhibit a part of an electronic component from being exposed to a temperature outside an appropriate operation temperature range during the burn-in-test by applying a test socket structure according to the present invention to a burn-in-socket in which the MCM structure is contained.

The present invention can be applied to an MCM (Multi Chip Module) having a plurality of electronic components mounted over an interposer substrate.

What is claimed is:

1. A manufacturing method of a semiconductor module, comprising the steps of:
    mounting a structure having an interposer substrate in a test socket,
        the interposer substrate having a top face and a bottom face, first and second electronic components mounted over said top face of said interposer substrate, and a plurality of solder materials arranged over said bottom face of said interposer substrate;
        the test socket having a first section having a recess and a second section having a first plane and a second plane, the bottom face of the interposer substrate facing the bottom face of said recess of said test socket; and
    after mounting the structure in the test socket, carrying out an electric characteristic test of said structure, wherein
    the mounting step includes:
        positioning said first and second planes of said second section over said first and second electronic components respectively, and
        applying a load from the side of said top face of said interposer substrate to said structure with said second section of said test socket so that loads are applied to said first and second electronic components through a first member provided between said first plane and said first electronic component and a second member provided between said second plane and said second electronic component respectively,
    an appropriate operation temperature range of said second electronic component mounted over said top face of said interposer substrate is narrower than an appropriate operation temperature range of said first electronic component,
    thermal conductivity of said second member is lower than thermal conductivity of said first member,
    the second member has a suction hole for holding the second electronic component, whereas the first member has no suction hole,
    the mounting step further includes after positioning the first and second planes, sucking an air through the suction hole in the second member to hold the second electronic component by the second section of the test socket in order to move the structure toward the first section of the test socket to apply the load, and
    the first electronic component has a first surface facing the top face of the interposer substrate and a second surface opposite to the first surface,
    the second electronic component has a third surface facing the top face of he interposer substrate and a fourth surface opposite to the third surface,
    the fourth surface of the second electronic component is located higher than the second surface of the first electronic component when the first and second electronic components are mounted over the top surface of the interposer substrate. and
    the first plane in the second section of the test socket is located closer to a bottom of the recess in the first section of the test socket than the second plane in the second section of the test socket when the second section of the test socket is set on the first section of the test socket to place the structure in the recess of the first section.

2. The manufacturing method of a semiconductor module according to claim 1, said first electronic component is cooled with a heat dissipation member.

3. The manufacturing method of a semiconductor module according to claim 1, wherein the thickness of said second member is larger than the thickness of said first member.

4. The manufacturing method of a semiconductor module according to claim 1, wherein the hardness of said second member is lower than the hardness of said first member.

5. The manufacturing method of a semiconductor module according to claim 1, wherein said first member is attached to said first plane of said test socket and said second member is attached to said second plane of said test socket.

6. The manufacturing method of a semiconductor module according to claim 1, wherein said first electronic component is a semiconductor chip mounted over said top face of said interposer substrate in the state of a bare chip and said second electronic component is a semiconductor package.

* * * * *